United States Patent
Xu et al.

(10) Patent No.: US 10,505,048 B1
(45) Date of Patent: Dec. 10, 2019

(54) SELF-ALIGNED SOURCE/DRAIN CONTACT FOR VERTICAL FIELD EFFECT TRANSISTOR

(71) Applicant: International Business Machines Corporation, Armonk, NY (US)

(72) Inventors: Wenyu Xu, Albany, NY (US); Chen Zhang, Guilderland, NY (US); Kangguo Cheng, Schenectady, NY (US); Xin Miao, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/117,221

(22) Filed: Aug. 30, 2018

(51) Int. Cl.
*H01L 21/8234* (2006.01)
*H01L 29/786* (2006.01)
*H01L 29/66* (2006.01)

(52) U.S. Cl.
CPC .... *H01L 29/78642* (2013.01); *H01L 29/6656* (2013.01); *H01L 29/66666* (2013.01); *H01L 29/78696* (2013.01)

(58) Field of Classification Search
CPC ........... H01L 29/66666; H01L 29/7827; H01L 21/823487
See application file for complete search history.

(56) References Cited

U.S. PATENT DOCUMENTS

| | | |
|---|---|---|
| 4,960,723 A | 10/1990 | Davies |
| 6,724,054 B1 | 4/2004 | Kang et al. |
| 7,176,089 B2 | 2/2007 | Furukawa et al. |
| 9,312,383 B1 | 4/2016 | Cheng et al. |
| 9,673,103 B2 | 6/2017 | Pritiskutch et al. |
| 9,698,230 B2 | 7/2017 | Cheng et al. |
| 9,721,897 B1 | 8/2017 | Cheng et al. |
| 9,735,253 B1 | 8/2017 | Bi et al. |
| 9,741,847 B2 * | 8/2017 | Pawlak ............... H01L 29/7827 |
| 9,761,491 B1 | 9/2017 | Huang et al. |
| 2006/0240654 A1 | 10/2006 | Wei et al. |
| 2012/0298949 A1 | 11/2012 | Chang et al. |
| 2013/0126980 A1 | 5/2013 | Bears et al. |
| 2018/0337256 A1 | 11/2018 | Anderson et al. |

FOREIGN PATENT DOCUMENTS

KR  20100052814 A  5/2010

* cited by examiner

*Primary Examiner* — Mark V Prenty
(74) *Attorney, Agent, or Firm* — Vazken Alexanian; Ryan, Mason & Lewis, LLP

(57) ABSTRACT

A method for manufacturing a semiconductor device includes forming a fin on a semiconductor substrate. In the method, a bottom source/drain region is formed between the fin and the semiconductor substrate, and a top source/drain region is formed on the fin. The method further includes forming a cap layer covering part of a top surface of the top source/drain region. A portion of the top source/drain region and an underlying portion of the fin not covered by the cap layer are removed. The removal exposes a portion of the bottom source/drain region. A dielectric spacer is formed on a side of the fin adjacent the exposed portion of the bottom source/drain region, and extends onto a side of the top source/drain region. A bottom source/drain contact is formed on the exposed portion of the bottom source/drain region and on the dielectric spacer.

15 Claims, 10 Drawing Sheets

100

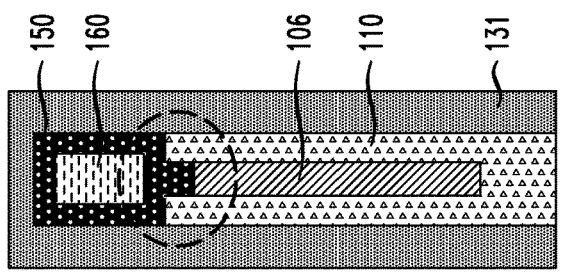
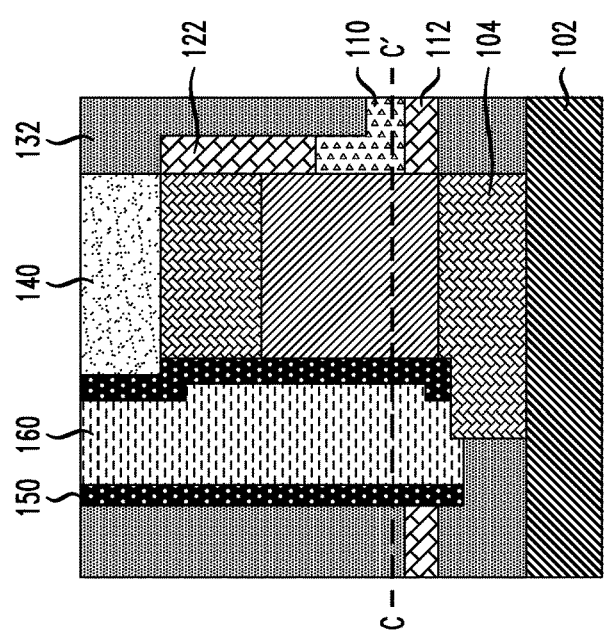
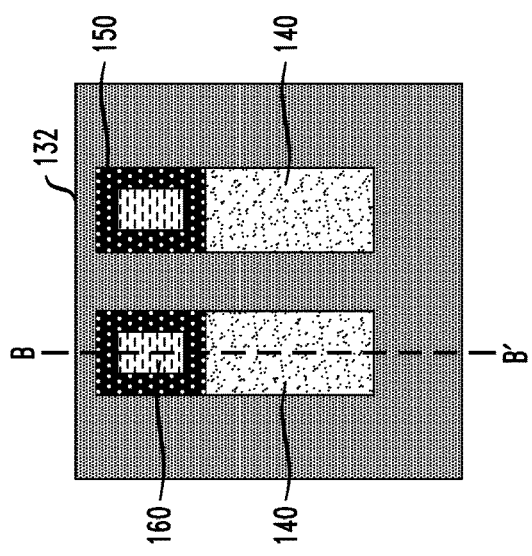
FIG. 10C
FIG. 10B
FIG. 10A

SELF-ALIGNED SOURCE/DRAIN CONTACT FOR VERTICAL FIELD EFFECT TRANSISTOR

TECHNICAL FIELD

The field generally relates to semiconductor devices and methods of manufacturing same and, in particular, to forming vertical field effect transistors (VFETs) with self-aligned source/drain contacts in relatively close proximity to vertical channel regions.

BACKGROUND

Fin field-effect transistor (FinFET) devices include a transistor architecture that uses raised source-to-drain channel regions, referred to as fins. Known FinFET devices include fins with source/drain regions on lateral sides of the fins, so that current flows in a horizontal direction (e.g., parallel to a substrate) between source/drain regions at opposite ends of the fins in the horizontal direction. As horizontal devices are scaled down, there is reduced space for metal gate and source/drain contacts, which leads to degraded short-channel control and increased middle of the line (MOL) resistance.

Vertical field-effect transistors (VFETs) (also referred to as vertical transport field effect transistors (VTFETs)) are becoming viable device options for scaling semiconductor devices (e.g., complementary metal oxide semiconductor (CMOS) devices) to 5 nanometer (nm) node and beyond. VFET devices include fin channels with source/drain regions at ends of the fin channels on top and bottom sides of the fins. Current runs through the fin channels in a vertical direction (e.g., perpendicular to a substrate), for example, from a bottom source/drain region to a top source/drain region. Vertical transport architecture devices are designed to address the limitations of horizontal device architectures in terms of, for example, density, performance, power consumption, and integration by, for example, decoupling gate length from the contact gate pitch, providing a FinFET-equivalent density at a larger contacted poly pitch (CPP), and providing lower MOL resistance.

In current VFET design, the distance from source/drain contacts to fin tips is relatively large due to concerns regarding overlays and shorts between gate and source/drain contacts, which results in an unwanted increase in device size or unwanted reductions in fin length.

SUMMARY

According to an exemplary embodiment of the present invention, a method for manufacturing a semiconductor device includes forming a fin on a semiconductor substrate. In the method, a bottom source/drain region is formed between the fin and the semiconductor substrate, and a top source/drain region is formed on the fin. The method further includes forming a cap layer covering part of a top surface of the top source/drain region. A portion of the top source/drain region and an underlying portion of the fin not covered by the cap layer are removed. The removal exposes a portion of the bottom source/drain region. A dielectric spacer is formed on a side of the fin adjacent the exposed portion of the bottom source/drain region, and extends onto a side of the top source/drain region. A bottom source/drain contact is formed on the exposed portion of the bottom source/drain region and on the dielectric spacer.

According to an exemplary embodiment of the present invention, a semiconductor device includes a bottom source/drain region on a semiconductor substrate. A fin is disposed on the bottom source/drain region, and a top source/drain region is disposed on the fin. A bottom source/drain contact is disposed on the bottom source/drain region, and a dielectric spacer is disposed on an end of the fin between the source/drain contact and the end of the fin. The dielectric spacer extends from the bottom source/drain region along the end of the fin to the top source/drain region.

According to an exemplary embodiment of the present invention, a method for manufacturing a vertical transistor device includes forming a vertical channel region on a semiconductor substrate. In the method, a bottom source/drain region is formed between the vertical channel region and the semiconductor substrate, and a top source/drain region is formed on the vertical channel region. The method further includes forming a cap layer masking part of a top surface of the top source/drain region, and removing an unmasked portion of the top source/drain region and an underlying portion of the vertical channel region. The removal exposes a portion of the bottom source/drain region. A dielectric spacer is formed on a side of the vertical channel region adjacent the exposed portion of the bottom source/drain region, and the dielectric spacer extends onto a side of the top source/drain region. A bottom source/drain contact is formed on the exposed portion of the bottom source/drain region and on the dielectric spacer.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which:

FIG. 10A is a top view illustrating bottom source/drain contact material deposition in a method of manufacturing a semiconductor device, according to an exemplary embodiment of the present invention.

FIG. 10B is a cross-sectional view taken along the line B-B' in FIG. 10A and illustrating bottom source/drain contact material deposition in a method of manufacturing a semiconductor device, according to an exemplary embodiment of the present invention.

FIG. 10C is a top mid-plane view taken along the line C-C' in FIG. 10B and illustrating bottom source/drain contact material deposition in a method of manufacturing a semiconductor device, according to an exemplary embodiment of the present invention.

DETAILED DESCRIPTION

Figure 1:
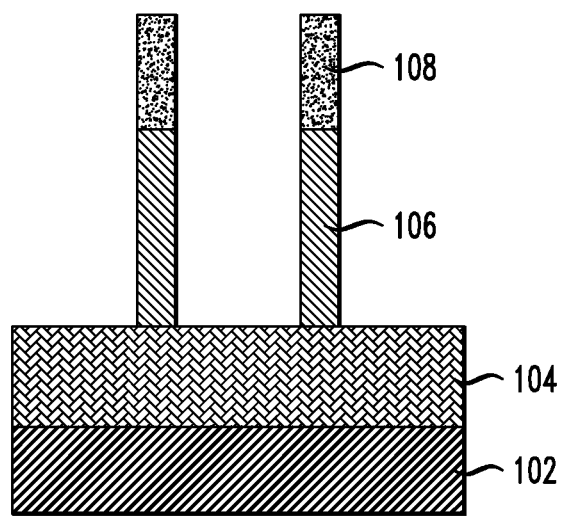
FIG. 1 is a cross-sectional view illustrating fin formation in a method of manufacturing a semiconductor device, according to an exemplary embodiment of the present invention.

Exemplary embodiments of the invention will now be discussed in further detail with regard to semiconductor devices and methods of manufacturing same and, in particular, to forming a VFET with a self-aligned bottom source/drain contact in relatively close proximity to a vertical channel region by trimming a top source/drain region and a fin to expose a bottom source/drain region.

It is to be understood that the various layers and/or regions shown in the accompanying drawings are not drawn to scale, and that one or more layers and/or regions of a type commonly used in, for example, FinFET, VFET, CMOS, field-effect transistor (FET), nanowire FET, nanosheet FETs, metal-oxide-semiconductor field-effect transistor (MOSFET), single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not necessarily be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FinFETs, VFETs, CMOSs, FETs, nanowire FETs, nanosheet FETs, SETs, and/or MOSFETs. By way of non-limiting example, the semiconductor devices can include, but are not necessarily limited to FinFET, VFET, CMOS, FET, nanowire FET, nanosheet FET, SET, CMOS and MOSFET devices, and/or semiconductor devices that use FinFET, VFET, CMOS, FET, nanowire FET, nanosheet FET, SET, CMOS and/or MOSFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

In accordance with one or more embodiments of the present invention, using a mask, fin edges are recessed to expose underlying active regions (e.g., bottom source/drain regions) on which a contact to the underlying active region will be formed. A spacer between the contact and the fin (e.g., vertical channel region) and between the contact and a top source/drain region is formed after fin tip recessing and prior to contact metal deposition. Embodiments of the present invention allow for a reduced distance between bottom source/drain contacts and fin ends so that a larger overall fin length than fin lengths in devices formed by conventional methods can be utilized for the same track height in cell layouts.

The cross-section in FIG. 1 is taken perpendicular to the length of the fins along the substrate. The cross-sections in FIGS. 2B, 3B, 4B, 5B, 6B, 7B, 8B, 9B and 10B are parallel to the length of the fins along the substrate.

FIG. 1 is a cross-sectional view illustrating fin formation in a method of manufacturing a semiconductor device 100, according to an exemplary embodiment of the present invention. Referring to FIG. 1, a semiconductor substrate 102 includes semiconductor material including, but not limited to, silicon (Si), silicon germanium (SiGe), silicon carbide (SiC), Si:C (carbon doped silicon), silicon germanium carbide (SiGeC), carbon doped silicon germanium (SiGe:C), III-V, II-VI compound semiconductor or other like semiconductor. In addition, multiple layers of the semiconductor materials can be used as the semiconductor material of the substrate. The semiconductor substrate 102 can be a bulk substrate or a semiconductor-on-insulator substrate such as, but not limited to, a silicon-on-insulator (SOI), silicon-germanium-on-insulator (SGOI) or III-V-on-insulator substrate including a buried insulating layer, such as, for example, a buried oxide, nitride layer or aluminum oxide.

Fins, such as fins 106, can be formed by patterning a portion of the semiconductor substrate 102 or a semiconductor layer on the substrate 102 into the fins 106. According to an embodiment, a hardmask 108 including, for example, a dielectric material, such as silicon nitride (SiN) is formed on portions of the semiconductor layer that are to be formed into the fins 104. The fin patterning can be done by various patterning techniques, including, but not necessarily limited to, directional etching and/or a sidewall image transfer (SIT) process, for example. The SIT process includes using lithography to form a pattern referred to as a mandrel. The mandrel material can include, but is not limited to, amorphous silicon or amorphous carbon. After the mandrel formation, a conformal film can be deposited and then followed by an etchback. The conformal film will form spacers at both sides of the mandrel. The spacer material can include, but is not limited, oxide or SiN. After that, the mandrel can be removed by reactive ion etching (RIE) processes. As a result, the spacers will have half the pitch of the mandrel. In other words, the pattern is transferred from a lithography-defined mandrel to spacers, where the pattern density is doubled. The spacer pattern can be used as the hard mask to form the fins by RIE processes. Alternatively, fin patterning can be done by any other suitable patterning technique, including but not limited to, lithography (e.g., extreme ultraviolet (EUV)) in conjunction with RIE, self-aligned double patterning (SADP), self-aligned multiple patterning (SAMP), and/or self-aligned quadruple patterning (SAQP)). While embodiments of the present invention describe channel regions as fins, the embodiments are not necessarily limited to fin channel regions, and may include nanowire channel regions. FIG. 1 illustrates two fins 106 on the substrate 102. Although two fins 106 are shown in the figures for ease of explanation, more than two fins can be formed.

A bottom source/drain layer 104 is formed on the substrate 102, for example, in recessed portions of the substrate 102 under and adjacent bottom portions of the plurality of fins 106. In one or more embodiments, the bottom source/drain layer 104 is formed by a bottom-up epitaxial growth process. The epitaxially grown bottom source/drain layer 104 can be in-situ doped, meaning dopants are incorporated into the epitaxy film during the epitaxy process. Other alternative doping techniques can be used, including but not limited to, for example, ion implantation, gas phase doping, plasma doping, plasma immersion ion implantation, cluster doping, infusion doping, liquid phase doping, solid phase doping, etc., and dopants may include, for example, an n-type dopant selected from a group of phosphorus (P), arsenic (As) and antimony (Sb), and a p-type dopant selected from a group of boron (B), gallium (Ga), indium (In), and thallium (Tl) at various concentrations. For example, in a non-limiting example, a dopant concentration range may be $1 \times 10^{18}/cm^3$ to $1 \times 10^{21}/cm^3$. The bottom source/drain layer 104 can be p-type or n-type. The bottom source/drain layer 104 is doped and the fins 106 are undoped.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 500° C. to 900° C. Although higher temperature typically results in faster deposition, the faster deposition may result in crystal defects and film cracking.

A number of different sources may be used for the epitaxial growth of the compressively strained layer. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, ldisilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Figure 2A:
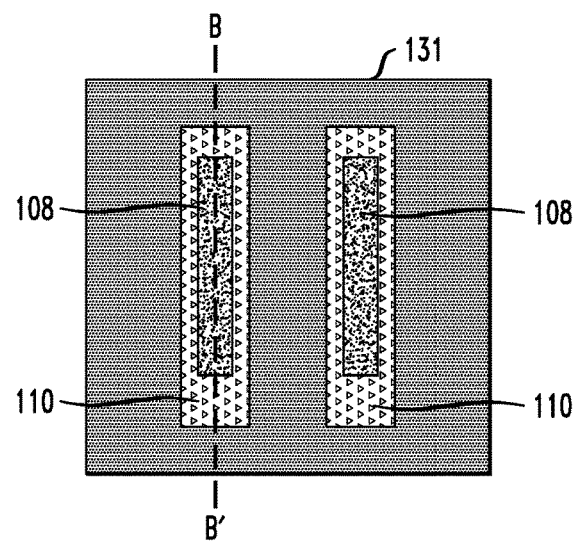
FIG. 2A is a top view illustrating active region patterning, bottom spacer and gate structure formation and inter-level dielectric layer deposition in a method of manufacturing a semiconductor device, according to an exemplary embodiment of the present invention.
Figure 2B:
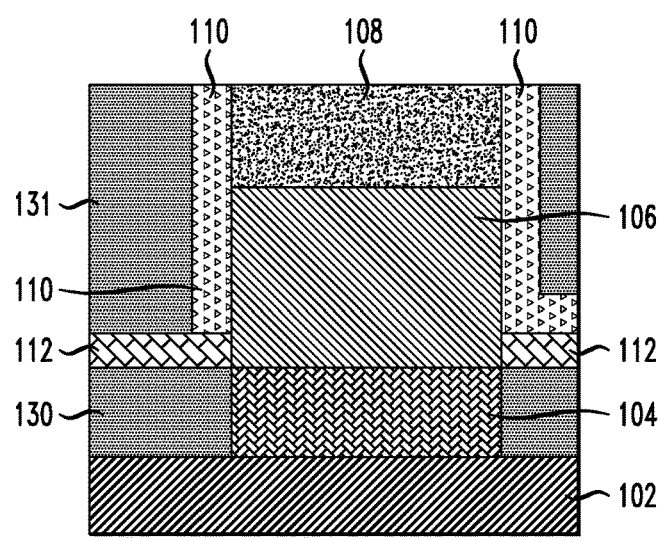
FIG. 2B is a cross-sectional view taken along the line B-B' in FIG. 2A and illustrating active region patterning, bottom spacer and gate structure formation and inter-level dielectric layer deposition in a method of manufacturing a semiconductor device, according to an exemplary embodiment of the present invention.

FIG. 2A is a top view and FIG. 2B is a cross-sectional view taken along the line B-B' in FIG. 2A illustrating active region patterning, bottom spacer and gate structure formation and inter-level dielectric layer deposition in a method of manufacturing a semiconductor device, according to an exemplary embodiment of the present invention. Referring to FIGS. 2A and 2B, using a cut mask (not shown), a length of the fins 106 along the substrate 102 and length of the underlying source/drain layer 104 are reduced so that edges of the fins 106 and underlying source drain layer 104 are coplanar with each other. The reduction is performed by removing portions of the stacked structure comprising the source/drain layer 104 and the fins and hardmasks 106, 108 stacked thereon not covered by the cut mask. In this way, an active region is defined by cutting (e.g., removing end portions of) the stacked structure to reduce a length thereof. Following cutting of the stacked structure, a first inter-layer dielectric (ILD) layer 130 is deposited on the substrate 102 and adjacent the bottom source/drain layer 104 using, for example, one or more deposition techniques including, but not limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering. The ILD layer 130 includes, for example, to silicon oxide (SiOx), where x is, for example, 2 in the case of silicon dioxide ($SiO_2$), or 1.99 or 2.01, low temperature oxide (LTO), high temperature oxide (HTO), flowable oxide (FOX) or some other dielectric.

A bottom spacer layer 112 comprising, for example, a low-k dielectric, is deposited on the ILD layer 130 and adjacent bottom portions of the fins 106 using one or more directional deposition techniques, including, but not necessarily limited to, high density plasma (HDP) and gas cluster ion beam (GCIB) processes. The low-k dielectric material has a dielectric constant (k value) less than 3.9, which is the dielectric constant of silicon dioxide ($SiO_2$). The dielectric material includes, but is not necessarily limited to, $SiO_2$, silsesquixoanes, carbon-doped silicon oxide (SiCOH), SiLK® dielectrics, or multi-layers thereof. The dielectric material includes porous or non-porous forms of these low-k dielectric films. The thickness of the bottom spacer layer 112 varies depending upon design constraints, and, generally, can be in the range of about 2 nm to about 10 nm.

Gate structures 110 comprising, for example, a high-k dielectric layer, a work function metal (WFM) layer deposited on the high-k dielectric layer, and a gate metal layer deposited on the WFM layer are formed on the bottom spacer layer 112 and on and around the fins 106 including the hardmasks 108 thereon. The high-k dielectric layers include, for example, a high-k material including, but not necessarily limited to, $HfO_2$ (hafnium oxide), $ZrO_2$ (zirconium dioxide), hafnium zirconium oxide $Al_2O_3$ (aluminum oxide), and $Ta_2O_5$ (tantalum pentoxide).

The WFM layers are deposited on the high-k dielectric layers and include, for example, titanium nitride (TiN), tantalum nitride (TaN), ruthenium (Ru), titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN or TaN.

The gate metal layers are deposited on the WFM layers and include, for example, a low resistance metal, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof.

The gate metal, WFM and high-k gate dielectric layers are deposited using, for example, one or more deposition techniques including, but not limited to, CVD, PECVD, RFCVD, PVD, ALD, MLD, MBD, PLD, LSMCD, sputtering, and/or plating.

A second ILD layer 131, including the same or similar dielectric material as the first ILD layer 130, is deposited to fill in vacant portions on the bottom spacer layer 112 and on and around the gate structures 110. Deposition of the second ILD layer 131 can be performed using one or more deposition techniques including, but not necessarily limited to, CVD, PECVD, RFCVD, PVD, ALD, MLD, MBD, PLD, LSMCD and/or sputtering, followed by a planarization process such as, for example, chemical mechanical planarization (CMP), down to the hardmasks 108.

Figure 3A:
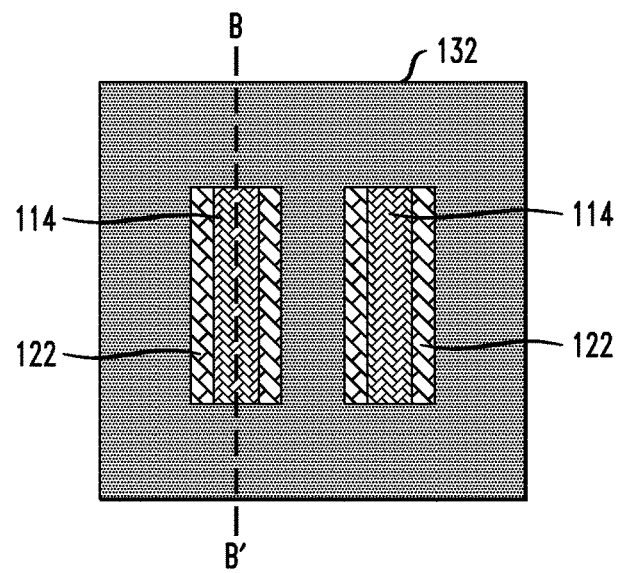
FIG. 3A is a top view illustrating gate structure recessing, top spacer and top source/drain region formation, top source/drain contact patterning and inter-level dielectric layer deposition in a method of manufacturing a semiconductor device, according to an exemplary embodiment of the present invention.
Figure 3B:
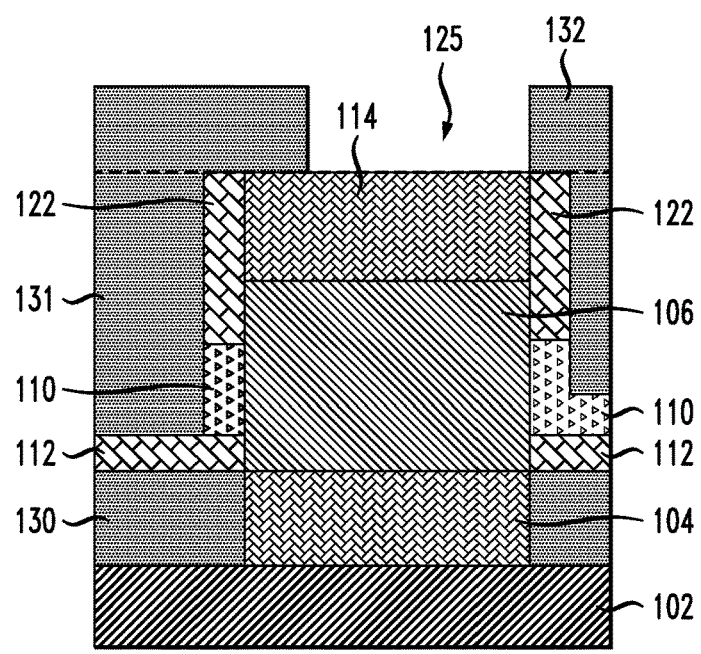
FIG. 3B is a cross-sectional view taken along the line B-B' in FIG. 3A and illustrating gate structure recessing, top spacer and top source/drain region formation, top source/drain contact patterning and inter-level dielectric layer deposition in a method of manufacturing a semiconductor device, according to an exemplary embodiment of the present invention.

FIG. 3A is a top view and FIG. 3B is a cross-sectional view taken along the line B-B' in FIG. 3A illustrating gate structure recessing, top spacer and top source/drain region formation, top source/drain contact patterning and inter-level dielectric layer deposition in a method of manufacturing a semiconductor device, according to an exemplary embodiment of the present invention. Referring to FIGS. 3A and 3B, an isotropic etch is performed to recess the gate structure including the gate metal, WFM and high-k gate dielectric layers down to a height below top surfaces of the fins 106. The gate structures 110 are recessed to a target height in the range of, for example, about 10 nm to about 50 nm.

Top spacer layers 122 comprising, for example, a low-k dielectric, are deposited on the recessed gate structures 110 and adjacent upper portions of the fins 106 using one or more directional deposition techniques, including, but not necessarily limited to, HDP and GCIB processes. The top spacer layers 122 fill in vacant portions left after the recessing of the gate structures 110.

The hardmasks 108 are removed, and top source/drain regions 114 are epitaxially grown from top surfaces of the fins 106 exposed after removal of the hardmasks 108. Epitaxial growth and doping of the top source/drain regions 114 is the same or similar to that of the bottom source/drain layer 104.

A third ILD layer 132, including the same or similar dielectric material as the first and second ILD layers 130 and 131, is deposited on the second ILD layer 131 and on the top source/drain regions 114. The boundary between the second and third ILD layers 131 and 132 is illustrated in FIG. 3B with a dotted line along a top surface of the second ILD layer 131 and a top surface of the top source/drain region 114. Deposition of the third ILD layer 132 can be performed using one or more deposition techniques including, but not necessarily limited to, CVD, PECVD, RFCVD, PVD, ALD, MLD, MBD, PLD, LSMCD and/or sputtering, followed by a planarization process such as, for example, CMP.

Following deposition of the third ILD layer 132, an opening 125 in the third ILD layer 132 is patterned to expose a portion of the top source/drain region 114. The opening 125 corresponds to an area where a top source/drain contact would subsequently be formed. The opening 125 is patterned using an RIE process.

Figure 4A:
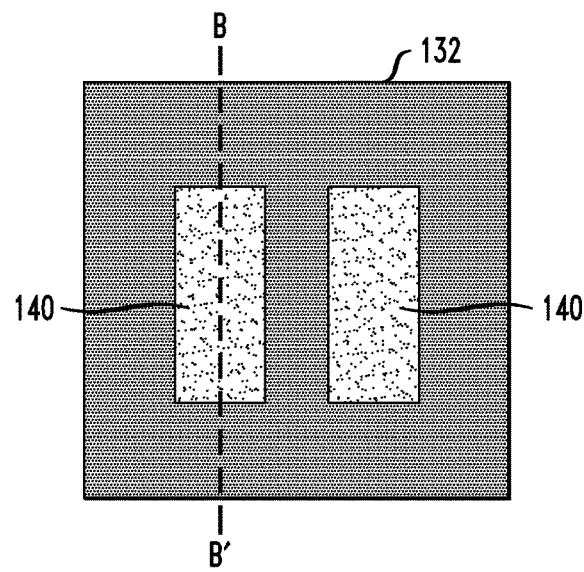
FIG. 4A is a top view illustrating formation of a self-aligned contact (SAC) cap layer in a method of manufacturing a semiconductor device, according to an exemplary embodiment of the present invention.
Figure 4B:
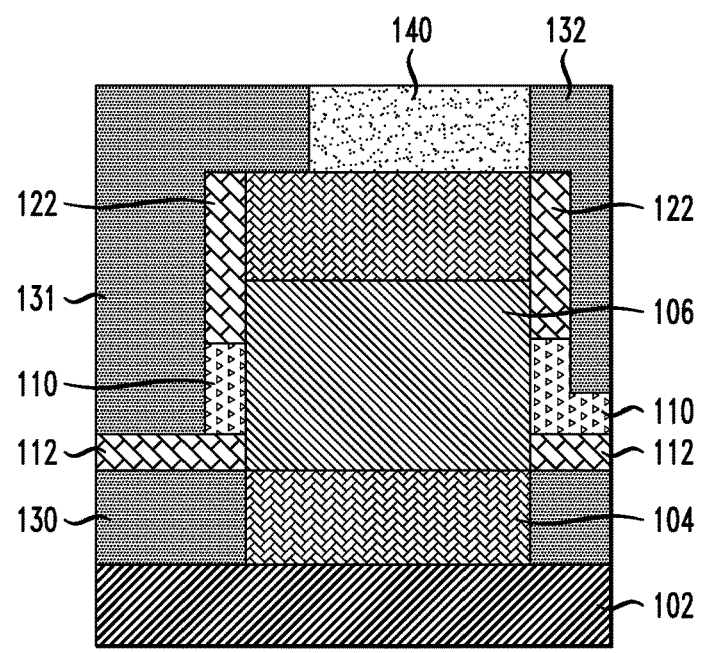
FIG. 4B is a cross-sectional view taken along the line B-B' in FIG. 4A and illustrating formation of an SAC cap layer in a method of manufacturing a semiconductor device, according to an exemplary embodiment of the present invention.

FIG. 4A is a top view and FIG. 4B is a cross-sectional view taken along the line B-B' in FIG. 4A illustrating formation of a self-aligned contact (SAC) cap layer in a method of manufacturing a semiconductor device, according to an exemplary embodiment of the present invention. Referring to FIGS. 4A and 4B, an SAC cap layer 140 is deposited in the opening 125 using one or more deposition techniques including, but not necessarily limited to, CVD, PECVD, RFCVD, PVD, ALD, MLD, MBD, PLD, LSMCD and/or sputtering, followed by a planarization process such as, for example, CMP. According to one or more embodiments, the SAC cap layer 140 is a dummy top source/drain contact until the SAC cap layer 140 is eventually removed and replaced with a top source/drain contact. The SAC cap layer 140 includes, but is not necessarily limited to, SiN, silicon boron nitride (SiBN), siliconborocarbonitride (SiBCN), silicon oxycarbonitride (SiOCN) or other dielectric.

Figure 5A:
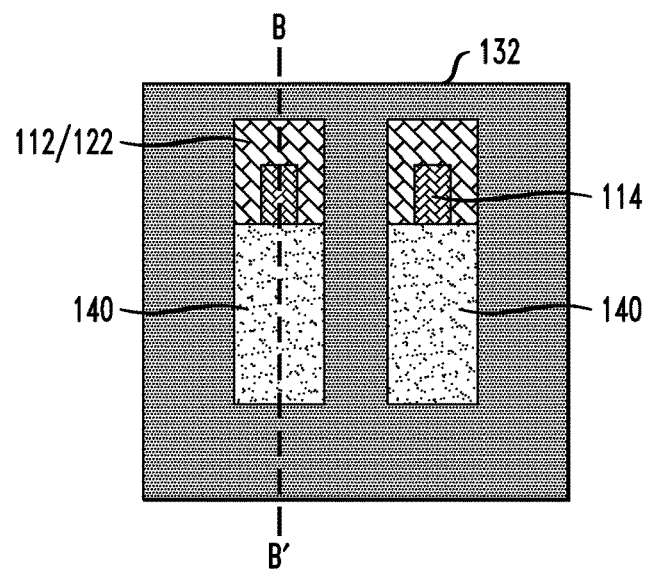
FIG. 5A is a top view illustrating ILD layer removal to expose top and bottom spacers and a portion of a gate structure in a method of manufacturing a semiconductor device, according to an exemplary embodiment of the present invention.
Figure 5B:
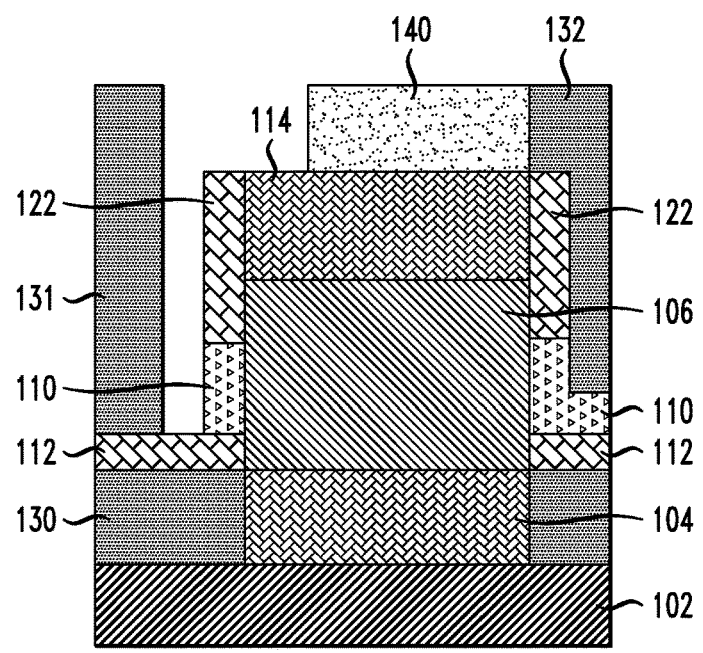
FIG. 5B is a cross-sectional view taken along the line B-B' in FIG. 5A and illustrating ILD layer removal to expose top and bottom spacers and a portion of a gate structure in a method of manufacturing a semiconductor device, according to an exemplary embodiment of the present invention.

FIG. 5A is a top view and FIG. 5B is a cross-sectional view taken along the line B-B' in FIG. 5A illustrating ILD layer removal to expose top and bottom spacers and a portion of a gate structure in a method of manufacturing a semiconductor device, according to an exemplary embodiment of the present invention. Referring to FIGS. 5A and 5B, using for example, a RIE process with $C_4F_8$ or $C_4F_6$, portions of the second and third ILD layers 131 and 132 are removed to expose portions of the top and bottom spacers 122 and 112 and a portion of a gate structure 110 on a side of the fin 106. In addition, part of the third ILD layer 132 on the top source/drain region 114 is removed, which exposes an upper surface of the top source/drain region 114. The etchant to remove the portions of the second and third ILD layers 131 and 132 is selective with respect to the material of the spacer layers 112, 122 and the SAC cap layer 140.

Figure 6A:
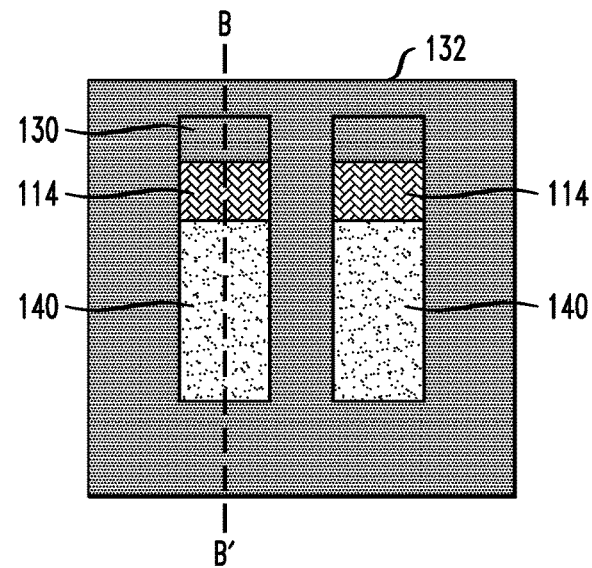
FIG. 6A is a top view illustrating removal of the exposed top and bottom spacers and the gate structure in a method of manufacturing a semiconductor device, according to an exemplary embodiment of the present invention.
Figure 6B:
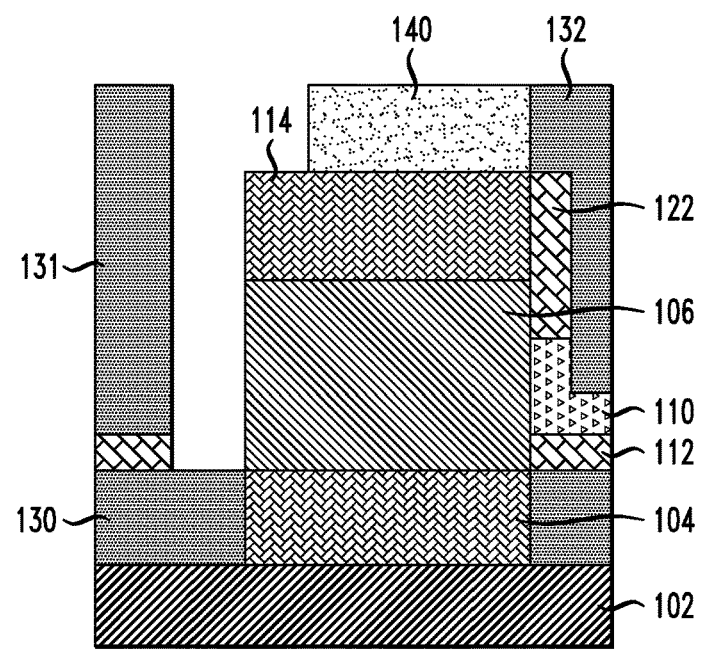
FIG. 6B is a cross-sectional view taken along the line B-B' in FIG. 6A and illustrating removal of the exposed top and bottom spacers and the gate structure in a method of manufacturing a semiconductor device, according to an exemplary embodiment of the present invention.

FIG. 6A is a top view and FIG. 6B is a cross-sectional view taken along the line B-B' in FIG. 6A illustrating removal of the exposed top and bottom spacers and the gate structure in a method of manufacturing a semiconductor device, according to an exemplary embodiment of the present invention. Referring to FIGS. 6A and 6B, the exposed portions of the top and bottom spacers 122 and 112 and the portion of the gate structure 110 on the side of the fin 106 exposed in the processing described in connection with FIGS. 5A and 5B, are stripped using, for example, an isotropic dry etch with $Cl_2$, $Cl_2/BCl_3$ or a wet etch with hot SC1 (water+$NH_3$+$H_2O_2$) for the gate structure 110, and an isotropic dry etch with $SF_6$, $CF_4$ or $NF_3$, or a wet etch with phosphoric acid for the top and bottom spacers 122 and 112. As a result of the removal of the portions of the top and bottom spacers 122 and 112 and the portion of the gate structure 110, an end side of the fin 106, and an end side of the top source/drain region 114 are exposed.

Figure 7A:
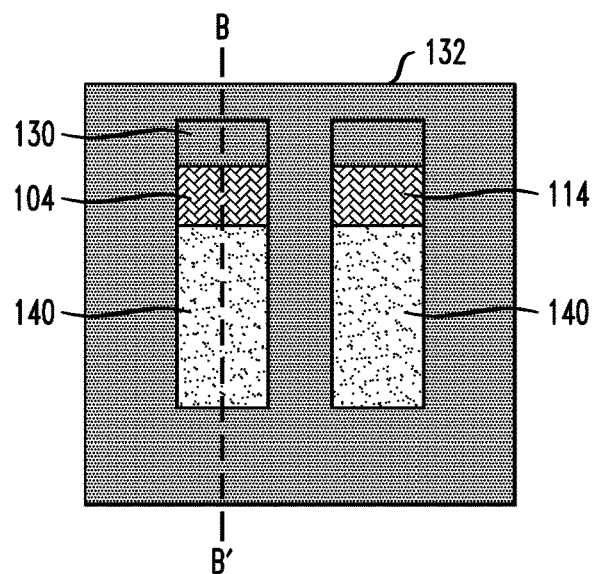
FIG. 7A is a top view illustrating directional removal of portions of the top source/drain region and the fin in a method of manufacturing a semiconductor device, according to an exemplary embodiment of the present invention.
Figure 7B:
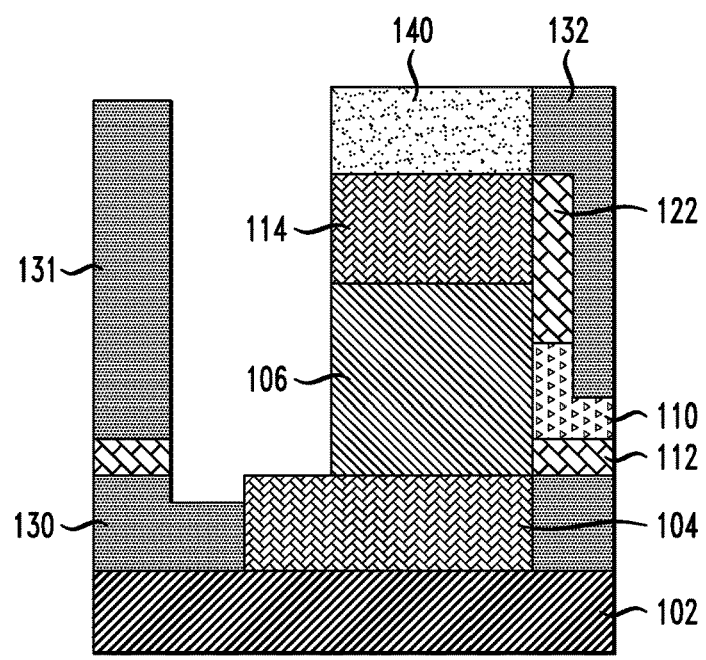
FIG. 7B is a cross-sectional view taken along the line B-B' in FIG. 7A and illustrating directional removal of portions of the top source/drain region and the fin in a method of manufacturing a semiconductor device, according to an exemplary embodiment of the present invention.

FIG. 7A is a top view and FIG. 7B is a cross-sectional view taken along the line B-B' in FIG. 7A illustrating directional removal of portions of the top source/drain region and the fin in a method of manufacturing a semiconductor device, according to an exemplary embodiment of the present invention. Referring to FIGS. 7A and 7B, portions of the top source/drain region 114 and the fin 106 not under the SAC cap layer 140 are removed down to the bottom source/drain layer 104. The removal is performed using, for example, an RIE process with $Cl_2/O_2$ or $HBr/O_2$. The SAC cap layer 140 on each fin 106 functions as a mask during the removal process to define a length of each fin 106, such that the fin end 106 and an end of the top source/drain region 114 is coplanar with an end of the SAC cap layer 140. During removal of the portions of the top source/drain region 114 and the fin 106, as shown in FIG. 7B, portions of the ILD layers 132, 131 and 130 may be optionally recessed (e.g., downward and to the left in FIG. 7B).

Figure 8A:
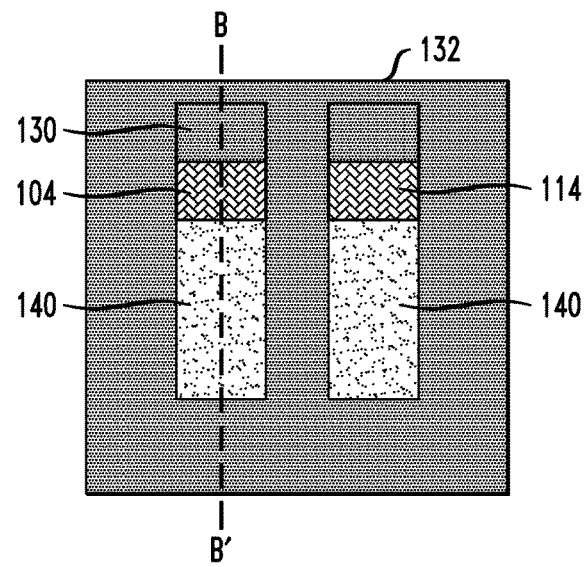
FIG. 8A is a top view illustrating conformal trimming of the top source/drain region and the fin in a method of manufacturing a semiconductor device, according to an exemplary embodiment of the present invention.
Figure 8B:
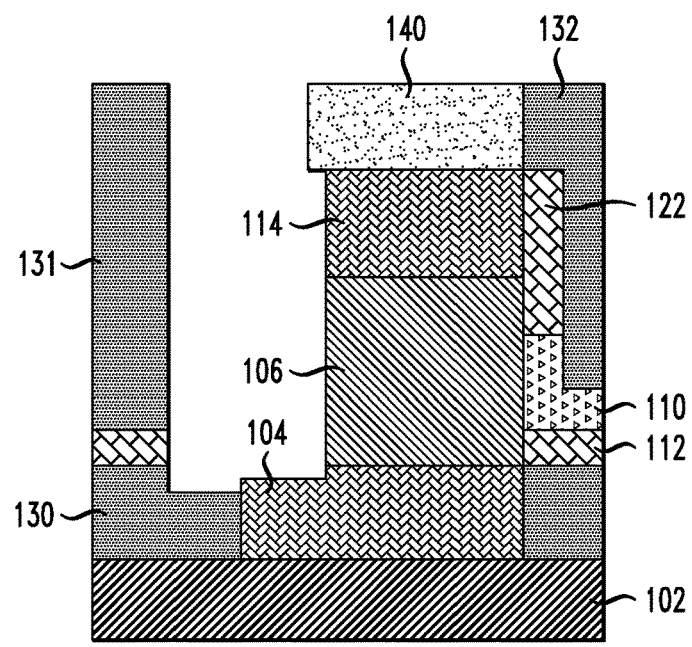
FIG. 8B is a cross-sectional view taken along the line B-B' in FIG. 8A and illustrating conformal trimming of portions of the top source/drain region and the fin in a method of manufacturing a semiconductor device, according to an exemplary embodiment of the present invention.

FIG. 8A is a top view and FIG. 8B is a cross-sectional view taken along the line B-B' in FIG. 8A illustrating conformal trimming of the top source/drain region and the fin in a method of manufacturing a semiconductor device, according to an exemplary embodiment of the present invention. Referring to FIGS. 8A and 8B, exposed ends of the top source/drain region 114 and of the fin 106 are laterally trimmed to laterally remove portions of the top source/drain region 114 and of the fin 106 under the SAC cap layer 140. For example, the lateral trimming recesses the top source/drain region 114 and the fin 106 with respect to the left side end of the SAC cap layer 140 in the range of about 1 nm to about 5 nm. As can be seen in FIG. 8A, the lateral recessing also downwardly recesses an exposed top surface of the source/drain layer 104.

Figure 9A:
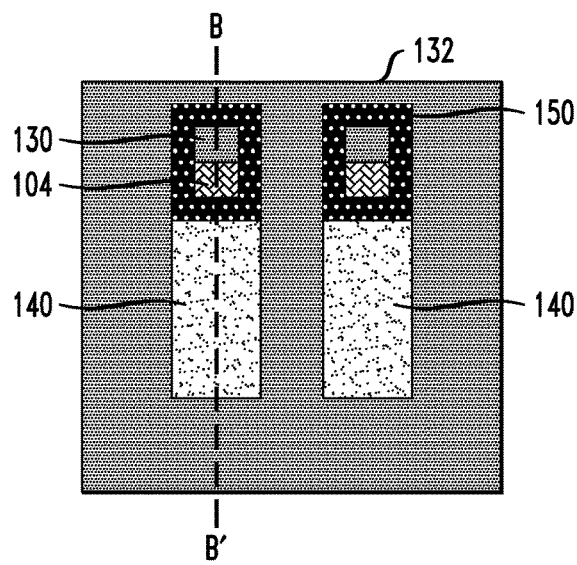
FIG. 9A is a top view illustrating contact spacer deposition and etchback in a method of manufacturing a semiconductor device, according to an exemplary embodiment of the present invention.
Figure 9B:
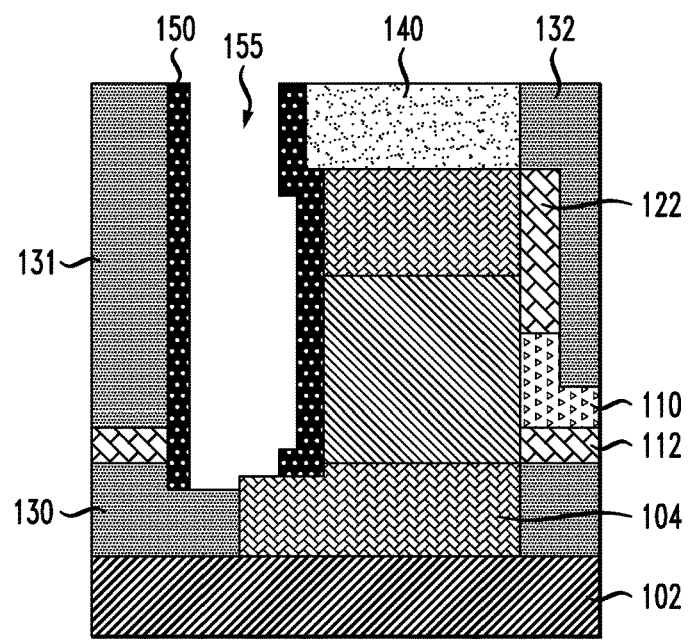
FIG. 9B is a cross-sectional view taken along the line B-B' in FIG. 9A and illustrating contact spacer deposition and etchback in a method of manufacturing a semiconductor device, according to an exemplary embodiment of the present invention.

FIG. 9A is a top view and FIG. 9B is a cross-sectional view taken along the line B-B' in FIG. 9A illustrating contact spacer deposition and etchback in a method of manufacturing a semiconductor device, according to an exemplary embodiment of the present invention. Referring to FIGS. 9A and 9B, spacers 150 are formed by conformally depositing a spacer layer on exposed portions of the ILD layers 130, 131 and 132, the SAC cap layers 140, fins 106 and top and bottom source/drain regions 114 and 104. Then, a directional etchback, such as a RIE process, is performed to remove most of the horizontal portions of the deposited spacer layer to result in the spacers 150 as shown in FIGS. 9A and 9B. The etchback process of the first bottom spacer material layer 140 is performed using, for example, diluted hydrofluoric acid.

The spacer layer is conformally deposited using, for example, one or more deposition techniques including, but not necessarily limited to, ALD. In accordance with an embodiment of the present invention, the spacers 150 comprise a low-k dielectric material such as, for example, $SiO_2$, silsesquixoanes, SiCOH, SiLK® dielectrics, or multi-layers thereof.

FIG. 10A is a top view, FIG. 10B is a cross-sectional view taken along the line B-B' in FIG. 10A, and FIG. 10C is a top mid-plane view taken along the line C-C' in FIG. 10B. FIGS. 10A-10C illustrate bottom source/drain contact material deposition in a method of manufacturing a semiconductor device, according to an exemplary embodiment of the present invention. Referring to FIGS. 10A-10C, bottom source/drain contact material 160 is formed in the opening 155 between the spacers 150 and on the bottom source/drain region 104, as well as on a portion of the ILD layer 130. The bottom source/drain contact material fills the openings 155 and includes, for example, electrically conductive material including, but not necessarily limited to, tungsten, cobalt, zirconium, tantalum, titanium, aluminum, ruthenium, and/or copper. A liner layer (not shown) including, for example, titanium and/or titanium nitride, may be formed on side and bottom surfaces of the opening 155 before filling the opening 155 with the bottom source/drain contact material 160. Deposition of the bottom source/drain contact material 160 can be performed using one or more deposition techniques, including, but not necessarily limited to, CVD, PECVD, PVD, ALD, MBD, PLD, LSMCD, and/or spin-on coating, followed by planarization using a planarization process, such as, for example, CMP.

Referring to FIG. 10B, part of the spacers 150 are formed on the bottom source/drain region 104 so that a spacer 150 extends from the bottom source drain region 104 along the end of a fin 106 to the top source/drain region 114 and along an end of the top source/drain region. Referring to the circled portion in FIG. 10C, the spacers 150 insulate the gate structure 110 formed around the fin 106 and the fin 106 from the bottom source/drain contact material 160.

As can be understood from the described embodiments, due to the exposure of the ends of the fins 106, the lengths of the fins 106 are reduced to expose underlying portions of bottom source/drain regions 104 on which contacts (e.g., source/drain contact material layers 160) to the bottom source/drain regions 104 are formed. The spacers 150 insulate the contact material 160 from the fins 106, top source/drain regions 114, top source/drain contacts and gate structures 110 so that the contact material 160 can be formed in close proximity to these structures without concerns over shorting.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor device, comprising:
    forming a fin on a semiconductor substrate;
    forming a bottom source/drain region between the fin and the semiconductor substrate;
    forming a top source/drain region on the fin;
    forming a cap layer covering part of a top surface of the top source/drain region;
    removing a portion of the top source/drain region and an underlying portion of the fin not covered by the cap layer, wherein the removal exposes a portion of the bottom source/drain region;
    forming a dielectric spacer on a side of the fin adjacent the exposed portion of the bottom source/drain region, wherein the dielectric spacer extends onto a side of the top source/drain region; and
    forming a bottom source/drain contact on the exposed portion of the bottom source/drain region and on the dielectric spacer.

2. The method according to claim 1, wherein the removal of the portion of the top source/drain region and the underlying portion of the fin reduces a length of the fin in a direction parallel to a top surface of the substrate.

3. The method according to claim 1, further comprising, following the removal of the portion of the top source/drain region and the underlying portion of the fin, laterally recessing a remaining portion of the top source/drain region and a remaining portion of the fin with respect to a side surface of the cap layer.

4. The method according to claim 1, further comprising:
    forming a gate structure on an end side of the fin; and
    forming a top spacer on the gate structure on the end side of the fin and an end side of the top source/drain region.

5. The method according to claim 4, further comprising forming one or more dielectric layers to fill in an area on the end sides on the fin and the top source/drain region and on the top surface of the top source/drain region.

6. The method according to claim 5, further comprising:
    forming an opening in a dielectric layer of the one or more dielectric layers on the top surface of the top source/drain region, wherein forming a cap layer comprising filling the opening with a dielectric material.

7. The method according to claim 5, further comprising forming an opening in the one or more dielectric layers to expose the gate structure and the top spacer.

8. The method according to claim 7, wherein the bottom source/drain contact is formed in at least part of the opening.

9. The method according to claim 7, further comprising removing the exposed gate structure and top spacer, wherein the removal of the exposed gate structure and top spacer exposes the end sides on the fin and the top source/drain region.

10. The method according to claim 9, wherein the end sides on the fin and the top source/drain region comprise part of the portion of the top source/drain region and the underlying portion of the fin not covered by the cap layer.

11. The method according to claim 9, wherein the gate structure is formed on a bottom spacer on the end side of the fin.

12. The method according to claim 11, wherein the opening exposes a portion of the bottom spacer.

13. The method according to claim 12, further comprising removing the exposed portion of the bottom spacer.

14. The method according to claim 1, further comprising removing an end of the fin and an end of the bottom source/drain region underlying the end of the fin prior to forming the top source/drain region.

15. A method for manufacturing a vertical transistor device, comprising:
    forming a vertical channel region on a semiconductor substrate;
    forming a bottom source/drain region between the vertical channel region and the semiconductor substrate;
    forming a top source/drain region on the vertical channel region;
    forming a cap layer masking part of a top surface of the top source/drain region;
    removing an unmasked portion of the top source/drain region and an underlying portion of the vertical channel region, wherein the removal exposes a portion of the bottom source/drain region;

forming a dielectric spacer on a side of the vertical channel region adjacent the exposed portion of the bottom source/drain region, wherein the dielectric spacer extends onto a side of the top source/drain region; and forming a bottom source/drain contact on the exposed portion of the bottom source/drain region and on the dielectric spacer.

* * * * *